(12) United States Patent
Gill et al.

(10) Patent No.: US 11,171,110 B2
(45) Date of Patent: Nov. 9, 2021

(54) BACKSIDE METALIZATION WITH THROUGH-WAFER-VIA PROCESSING TO ALLOW USE OF HIGH Q BONDWIRE INDUCTANCES

(71) Applicant: SKYWORKS SOLUTIONS, INC., Irvine, CA (US)

(72) Inventors: Bharatjeet Singh Gill, Ottawa (CA); Grant Darcy Poulin, Carp (CA)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 15/958,152

(22) Filed: Apr. 20, 2018

(65) Prior Publication Data

US 2018/0315730 A1 Nov. 1, 2018

Related U.S. Application Data

(60) Provisional application No. 62/490,766, filed on Apr. 27, 2017.

(51) Int. Cl.
*H01L 23/00* (2006.01)
*H01L 25/065* (2006.01)
(Continued)

(52) U.S. Cl.
CPC ............ *H01L 24/49* (2013.01); *H01L 21/565* (2013.01); *H01L 23/3114* (2013.01); *H01L 23/481* (2013.01); *H01L 24/09* (2013.01); *H01L 24/48* (2013.01); *H01L 24/73* (2013.01); *H01L 25/0657* (2013.01); *H01L 25/50* (2013.01); *H01L 24/16* (2013.01); *H01L 24/32* (2013.01); *H01L 24/85* (2013.01); *H01L 2224/02372* (2013.01); *H01L 2224/02377* (2013.01); *H01L 2224/04042* (2013.01); *H01L 2224/04105* (2013.01); *H01L 2224/056* (2013.01); *H01L 2224/05548* (2013.01); *H01L 2224/05568* (2013.01); *H01L 2224/131* (2013.01); *H01L 2224/13147* (2013.01); *H01L 2224/16145* (2013.01); *H01L 2224/16227* (2013.01); *H01L 2224/2919* (2013.01); *H01L 2224/32145* (2013.01); *H01L 2224/45144* (2013.01); *H01L 2224/4809* (2013.01); *H01L 2224/4813* (2013.01); *H01L 2224/48149* (2013.01);
(Continued)

(58) Field of Classification Search
CPC ... H01L 24/49; H01L 21/565; H01L 23/3114; H01L 23/481; H01L 24/85
See application file for complete search history.

(56) References Cited

U.S. PATENT DOCUMENTS 6,377,464 B1 * 4/2002 Hashemi ................. H01L 25/16
361/760
8,058,715 B1 * 11/2011 Roa ...................... H01L 23/3128
257/686

(Continued)

*Primary Examiner* — Elias Ullah
(74) *Attorney, Agent, or Firm* — Lando & Anastasi, LLP

(57) ABSTRACT

A flip-chip integrated circuit die includes a front side including active circuitry formed therein and a plurality of bond pads in electrical communication with the active circuitry, at least two through-wafer vias extending at least partially though the die and having portions at a rear side of the die, and a bond wire external to the die and electrically coupling the portions of the at least two through-wafer vias at the rear side of the die.

14 Claims, 9 Drawing Sheets

(51) Int. Cl.
*H01L 25/00* (2006.01)
*H01L 21/56* (2006.01)
*H01L 23/48* (2006.01)
*H01L 23/31* (2006.01)

(52) U.S. Cl.
CPC ............... *H01L 2224/4912* (2013.01); *H01L 2224/73215* (2013.01); *H01L 2224/73253* (2013.01); *H01L 2224/73257* (2013.01)

(56) References Cited

U.S. PATENT DOCUMENTS

| | | | |
|---|---|---|---|
| 2011/0147917 A1* | 6/2011 | England | H01L 23/3677 257/692 |
| 2012/0018892 A1* | 1/2012 | Soltan | H01L 23/481 257/773 |
| 2012/0146214 A1* | 6/2012 | Soltan | H01L 23/3121 257/737 |
| 2012/0211487 A1* | 8/2012 | Bergstedt | H01L 23/36 219/679 |

* cited by examiner

BACKSIDE METALIZATION WITH THROUGH-WAFER-VIA PROCESSING TO ALLOW USE OF HIGH Q BONDWIRE INDUCTANCES

CROSS-REFERENCE TO RELATED APPLICATIONS

This application claims priority under 35 U.S.C. § 119(e) to U.S. Provisional Patent Application Ser. No. 62/490,766, titled "BACKSIDE METALIZATION WITH THROUGH-WAFER-VIA PROCESSING TO ALLOW USE OF HIGH Q BONDWIRE INDUCTANCES," filed Apr. 27, 2017, which is incorporated by reference herein in its entirety.

BACKGROUND

1. Field of Invention

The present invention relates generally to wafer level chip scale packages (WLCSP) and flip-chip designs including external bond wires.

2. Discussion of Related Art

To date, there is no known solution for using bond wires in WLCSP or flip-chip Integrated Circuit (IC) designs. Bumped chips are typically soldered to a laminate or printed circuit board (PCB) face down so there is no way of connecting bond wires to on-chip circuitry.

SUMMARY OF INVENTION

According to one aspect of the present invention there is provided a flip-chip integrated circuit die. The flip-chip integrated circuit die comprises a front side including active circuitry formed therein and a plurality of bond pads in electrical communication with the active circuitry, at least two through-wafer vias extending at least partially though the die and having portions at a rear side of the die, and a bond wire external to the die and electrically coupling the portions of the at least two through-wafer vias at the rear side of the die.

In some embodiments, the flip-chip integrated circuit die further comprises backside metallization disposed on at least the portions of the at least two through-wafer vias at the rear side of the die. The bond wire may be electrically coupled to the portions of the at least two through-wafer vias through the backside metallization.

In some embodiments, the active circuitry forms at least a portion of a power amplifier. The bond wire may be an inductive element in a matching circuit for the power amplifier. The bond wire may exhibit a quality factor of at least 60 or at least 70.

In some embodiments, the active circuitry includes radio frequency circuitry.

In accordance with another aspect an electronics module comprises a flip-chip integrated circuit die. The flip-chip integrated circuit die includes a front side including active circuitry formed therein and a plurality of bond pads in electrical communication with the active circuitry, at least two through-wafer vias extending at least partially though the die and having portions at a rear side of the die, and a bond wire external to the die and electrically coupling the portions of the at least two through-wafer vias at the rear side of the die.

In accordance with another aspect, an electronic device comprises an electronics module including a flip-chip integrated circuit die. The flip-chip integrated circuit die includes a front side including active circuitry formed therein and a plurality of bond pads in electrical communication with the active circuitry, at least two through-wafer vias extending at least partially though the die and having portions at a rear side of the die, and a bond wire external to the die and electrically coupling the portions of the at least two through-wafer vias at the rear side of the die.

In accordance with another aspect, a radio frequency device comprises an electronics module including a flip-chip integrated circuit die. The flip-chip integrated circuit die includes a front side including active circuitry formed therein and a plurality of bond pads in electrical communication with the active circuitry, at least two through-wafer vias extending at least partially though the die and having portions at a rear side of the die, and a bond wire external to the die and electrically coupling the portions of the at least two through-wafer vias at the rear side of the die.

In accordance with another aspect, there is provided a method of fabricating a flip-chip integrated circuit die. The method comprises fabricating active circuitry on a front side of the die, forming at least two through-wafer vias passing through at least a portion of the die and having portions at a rear side of the die, and electrically coupling the portions of the at least two through-wafer vias at the rear side of the die with a bond wire external to the die.

In some embodiments, fabricating the active circuitry includes forming a radio frequency power amplifier in the die. Electrically coupling the portions of the at least two through-wafer vias at the rear side of the die with the bond wire may include forming a portion of a matching circuit for the power amplifier.

In some embodiments, the method further comprises depositing backside metallization on the portions of the at least two through-wafer vias at the rear side of the die and electrically coupling the portions of the at least two through-wafer vias at the rear side of the die with the bond wire through the backside metallization.

In some embodiments, the method further comprises performing a measurement of one or more electrical parameters of the active circuitry and forming the bond wire with a length selected based on the measurement of the one or more electrical parameters of the active circuitry.

In some embodiments, the method further comprises performing a measurement of one or more electrical parameters of the active circuitry and forming the bond wire with a geometry selected based on the measurement of the one or more electrical parameters of the active circuitry.

In accordance with another aspect, there is provided an electrical structure comprising a first integrated circuit die including a front side having active circuitry formed therein, a plurality of bond pads in electrical communication with the active circuitry, and at least two through-wafer vias extending at least partially though the die and having portions at a rear side of the die, a second integrated circuit die including a rear side mounted on the rear side of the first integrated circuit die and having bond pads disposed on a front side thereof, and at least one bond wire external to the first integrated circuit die and the second integrated circuit die and electrically coupling at least one of the at least two through-wafer vias of the first integrated circuit die to at least one bond pad of the second integrated circuit die.

In some embodiments, the first integrated circuit die includes active circuitry in the front side thereof and the second integrated circuit die includes active circuitry in the front side thereof.

In some embodiments, the bond wire is an inductive element in a matching circuit for active circuitry in one of the first integrated circuit die and the second integrated circuit die. The bond wire may exhibit a quality factor of at least 60 or at least 70. The active circuitry may include a power amplifier.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation, and are not intended as a definition of the limits of the invention. In the drawings.

DETAILED DESCRIPTION

Figure 1:
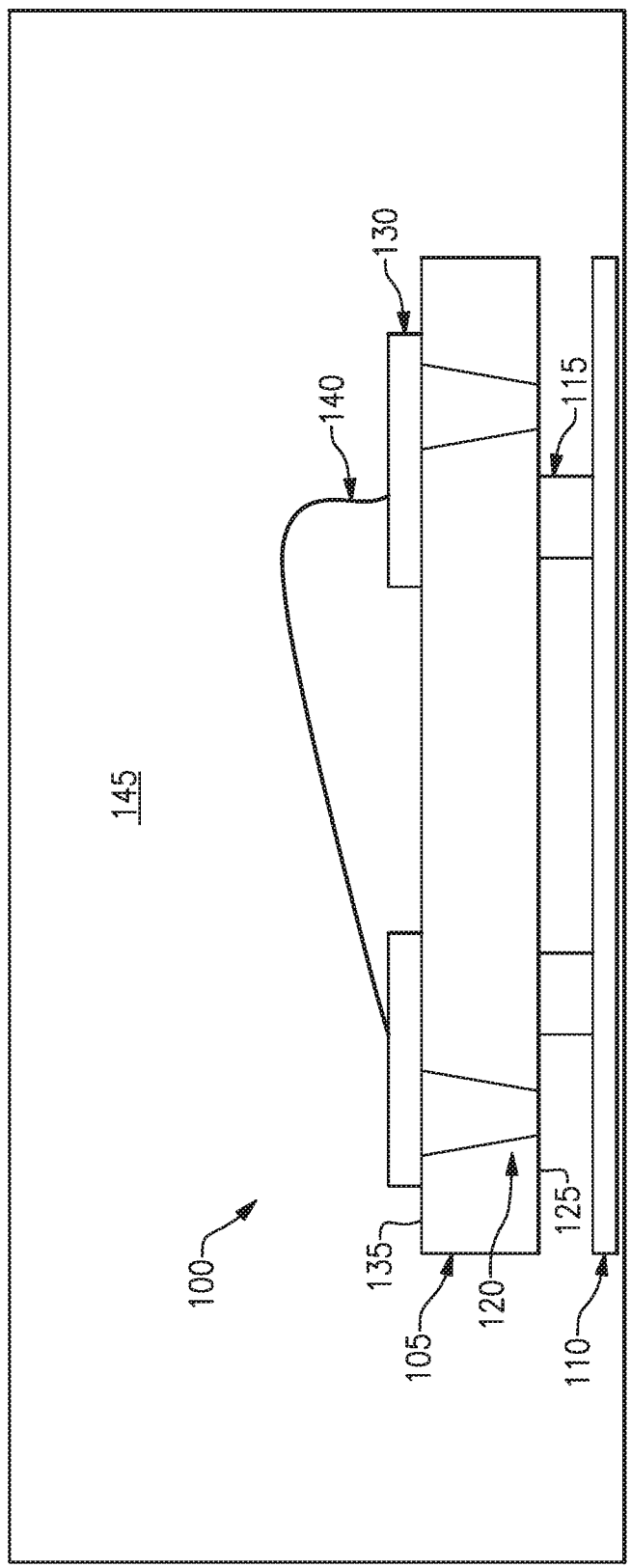
FIG. 1 is a cross-sectional elevational view of an embodiment of a flip-chip die design.

Various aspects and embodiments disclosed herein relate to an improved design for packaging of ICs using WLCSP or flip-chip designs in which external bond wires are electrically coupled to on-chip circuitry. The external bond wires may be utilized as inductive elements in, for example, matching circuits for devices defined within the IC chip or to electrically couple together different ICs. The device designs and methods disclosed herein may improve thermal management and reduce required substrate area for a particular IC.

In wirebond designs, bond wires provide high quality factor (high Q) inductance and tunability that is not available in conventional WLCSP or flip-chip designs. In conventional WLCSP or flip-chip designs, inductors that might be utilized in, for example, matching circuits in an integrated circuit die are built from metal layers within the integrated circuit die itself and are not accessible for adjustment to correct for manufacturing process variability and the like. In addition, on-chip integrated inductors incur higher losses degrading the efficiency of the design. In contrast, when external bond wires are used as inductors, they may be tuned by providing a bond wire length or geometry that gives a desired inductance for a particular integrated circuit.

In various aspects and embodiments disclosed herein flip-chip designs for power amplifiers provide an improved thermal environment over traditional bondwire designs.

In accordance with aspects and embodiments disclosed herein, the best of both wirebond and flip-chip designs can be realized in one design yielding a more energy efficient, tunable, and thermally improved design.

In various aspects and embodiments disclosed herein through-wafer vias and backside metallization are provided in WLCSP or flip-chip designs. In various aspects and embodiments disclosed herein circuit connections are brought to the backside of the die and are connected to a pad to which bond wires are connected.

In various aspects and embodiments disclosed herein in which bond wires are used as inductive and interconnect components, the amount of PCB or laminate area needed to accommodate an IC die is reduced compared to traditional WLCSP or flip-chip designs. Space within the die that would otherwise be occupied by inductors is saved by forming the inductors from bond wires external to the die, providing for a reduction in die size.

Further advantages of aspects and embodiments disclosed herein are improvement in quality factor (Q) of the inductive elements of an integrated circuit due to forming the inductive elements from bond wires external to the die where they may exhibit less coupling to other circuit elements than if they were formed from metal layers within the die. In some examples, bond wires external to the die used as inductive elements may exhibit a Q of between about 60 and about 70 or more. In comparison, inductors formed from metal layers internal to a die typically exhibit a Q of 50 or less. The bond wires may also support higher currents or heat up less with a comparable current than the typically small cross-sectional area inductors that could be formed from metal layers within a die.

In some embodiments, external bond wires may exhibit inductances that may be tunable. After fabrication of an integrated circuit, test equipment may be utilized to measure electrical parameters of circuitry or devices, for example, power amplifiers within the integrated circuit. Such parameters may include output power, efficiency, linearity, input or output impedance, capacitance, inductance, or other electrical parameters of interest. The length, geometry (for example, degree of coiling or curvature), or both of bond wires to be externally connected to circuitry in the IC may be selected to provide a desired inductance based on the measured electrical parameters of the devices. This may allow for deviations in electrical parameters due to manufacturing variability or inaccurate modelling to be compensated for by providing the ability to add tunable inductors to the circuitry of the IC after the internal components and devices of the IC are fabricated.

A first embodiment of a flip-chip device as disclosed herein is illustrated in elevational view in FIG. 1, generally at 100. The flip-chip (or WLCSP) device 100 includes a chip scale package (CSP) die 105 flip-chip mounted to a substrate 110, for example, a printed circuit board or laminated substrate with conductive connectors 115, for example, copper pillars or solder balls. The conductive connectors 115 electrically and thermally connect bond pads (not shown) coupled to circuitry on the die 105 to substrate bonding pads (not shown) on the substrate 110, which in turn are coupled to electrical traces (not shown) for providing communication between the circuitry in the die 105 and external electronics, as well as for providing power to the circuitry in the die 105. The die 105 includes through-wafer vias 120 that may provide electrical and thermal communication between circuitry located within or at a front surface 125 of the die 105 and backend metallization 130 disposed on the rear 135 of the die 105. At least one bond wire 140, for example, a gold bond wire, may provide electrical communication between different areas of backend metallization 130 and circuitry in the die 105 electrically connected to the different areas of backend metallization 130. At least one bond wire 140 may be utilized as an inductor in electrical communication with other circuitry within the die 105. At least one bond wire 140 may be utilized as, for example, an inductor for a matching circuit for a power amplifier or other device formed within the die 105. In some embodiments, the die 105 and at least one bond wire 140 are encapsulated in an overmold material 145, for example, epoxy or other overmold material known in the art for protection (mechanical and/or moisture and/or chemical and/or EMI protection) from the external environment.

Figure 2:
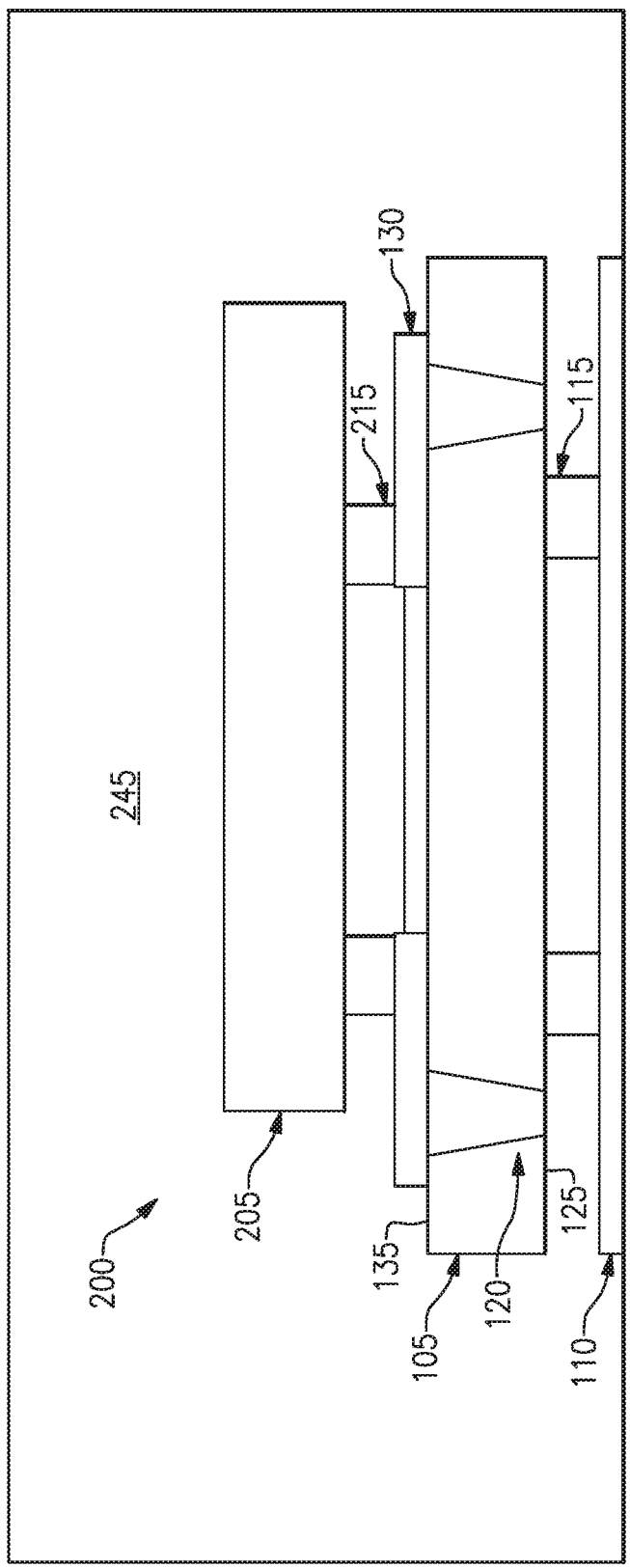
FIG. 2 is a cross-sectional elevational view of an embodiment of a stacked flip-chip die design.

In some embodiments, for example, as illustrated generally at 200 in FIG. 2, a second die 205, which may be a chip scale package die, may be flip-chip mounted on the rear 135 of the die 105 (die 105 may be referred to herein as the "first die" when used in conjunction with other die) and electrically coupled to the backend metallization 130 or directly to the through-wafer vias 120 of the die 105 with conductive connectors 215, for example, copper pillars or solder balls. In some embodiments, even further die may be mounted on the second die 205. The resultant die stack may be encapsulated in an overmold material 245, for example, epoxy or other overmold material known in the art for protection (mechanical and/or moisture and/or chemical and/or EMI protection) from the external environment.

Figure 3:
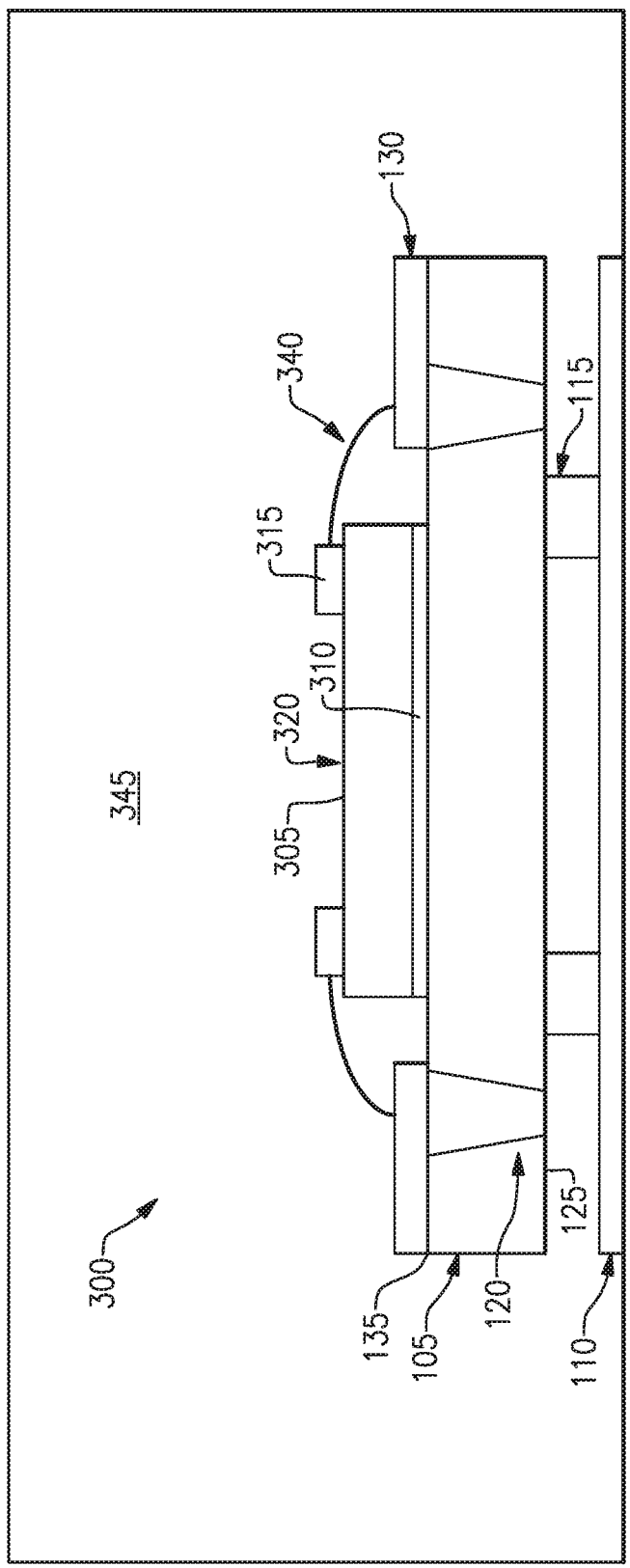
FIG. 3 is a cross-sectional elevational view of an embodiment of a stacked flip-chip/wirebond die design.

In another embodiment, for example, as illustrated generally at 300 in FIG. 3, a second die 305, which may be a wire-bond die, may be mounted right side up on the rear 135 of the first die 105 with an adhesive 310, for example, epoxy or solder. Bond pads 315 disposed on the active device surface 320 or upper surface of the second die 305 may be electrically coupled to the backend metallization 130 and associated circuitry of the first die 105 with one or more bond wires 340, for example, gold bond wires. The resultant die stack may be encapsulated in an overmold material 345, for example, epoxy or other overmold material known in the art for protection (mechanical and/or moisture and/or chemical and/or EMI protection) from the external environment.

Figure 4:
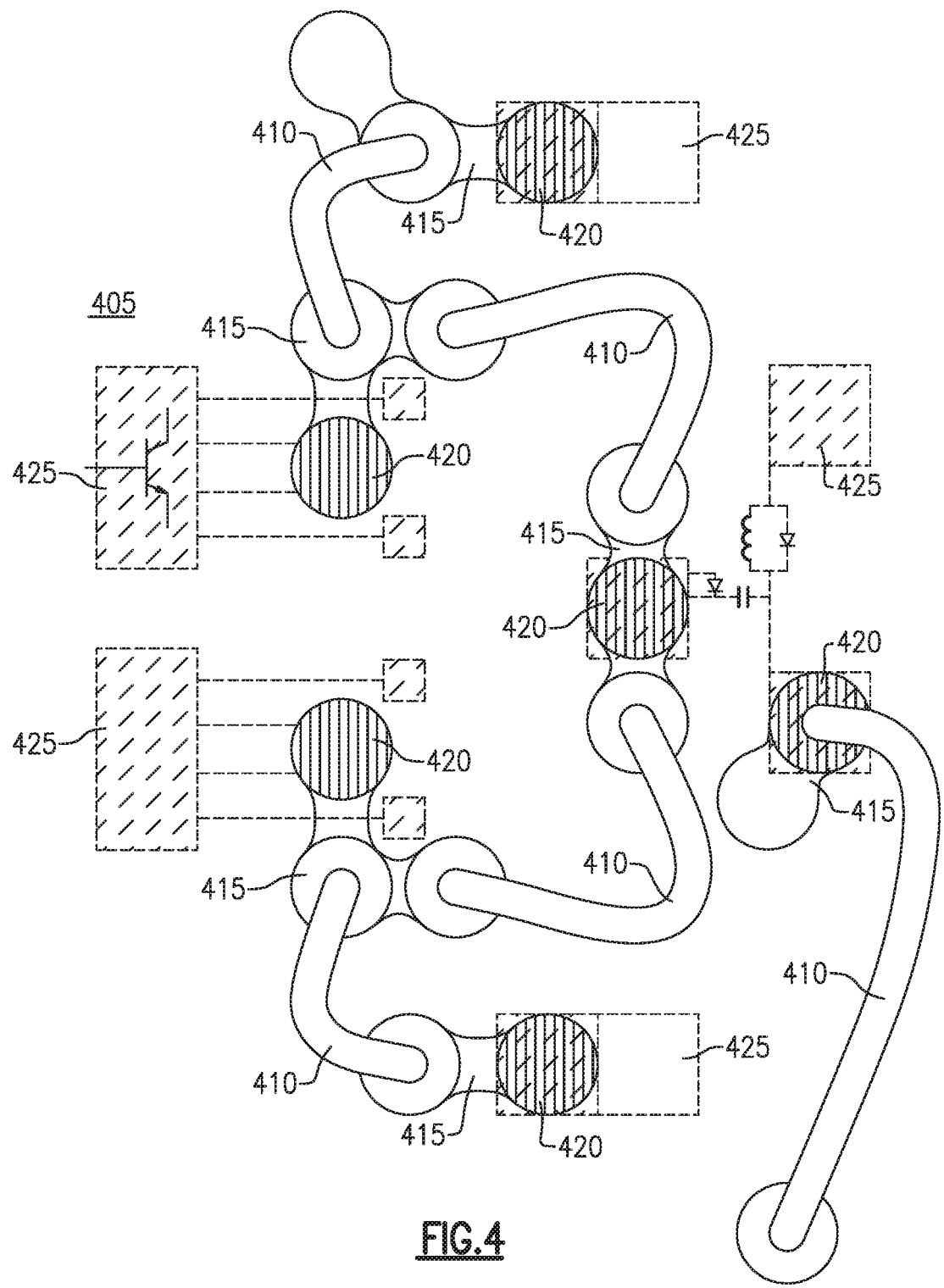
FIG. 4 is a plan view of an embodiment of an arrangement of bond wires forming a portion of a matching network for circuitry of a die.

A plan view of an example of an arrangement of external bond wires 410 that may be utilized to form a portion of, for example, an output matching network for a power amplifier included in a die 405 is illustrated in FIG. 4. The bond wires 410 may be electrically connected to backside metallization 415 that is in turn electrically coupled to through-wafer vias 420 in electrical communication with various devices 425 or circuits within or formed on a top surface of the die 405.

Figure 5:
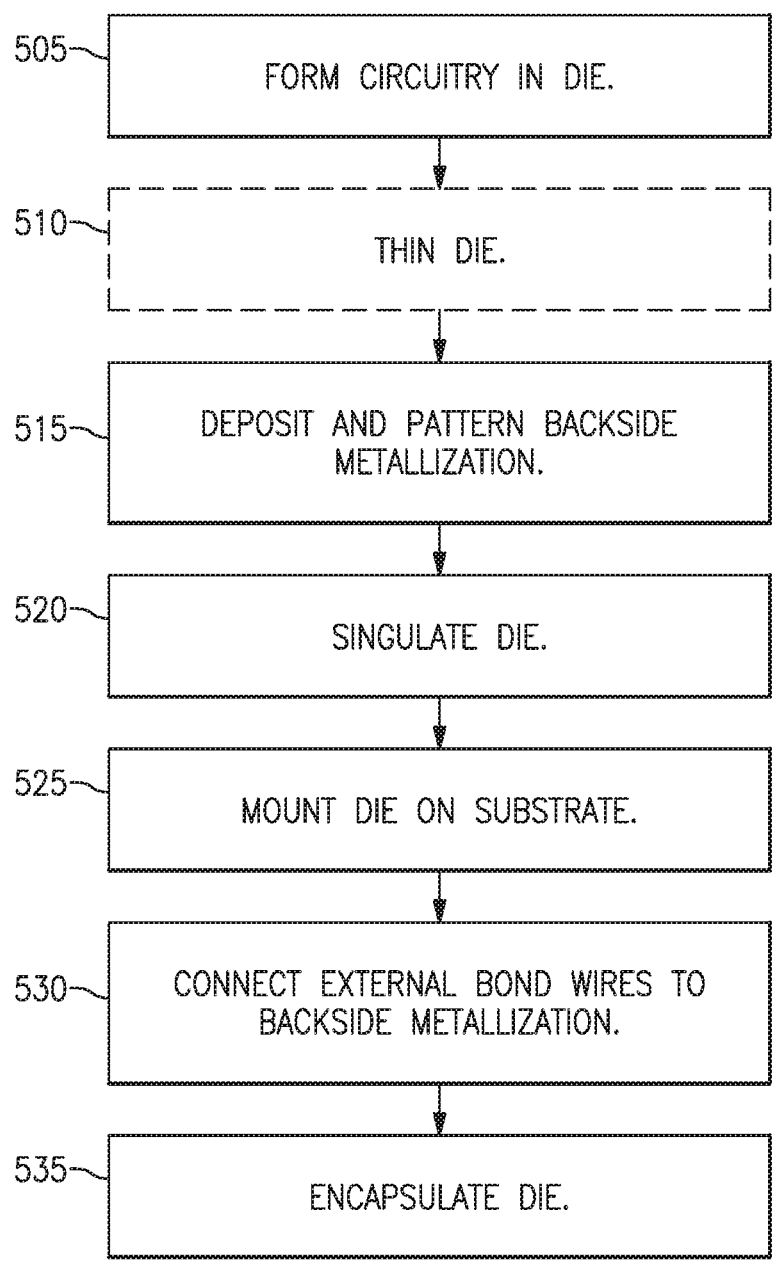
FIG. 5 is a flow chart of a method of forming a flip-chip mounted integrated circuit die.

A method of fabricating a packaged die such as shown in FIG. 1 is illustrated in the flow chart of FIG. 5. In a first act 505, the circuitry in the die is formed using conventional semiconductor fabrication methods. The die may be formed on a wafer concurrently with many other die. During the formation of the circuitry of the die, through-wafer vias are formed that provide electrical paths between circuitry in the die and the back side of the die. In act 510, the die is optionally thinned with, for example, backside grinding. Backside metallization is deposited and patterned on the rear of the die in act 515. At least some portions of the backside metallization make electrical contact with at least some of the through-wafer vias formed in the die. The die is singulated from the wafer in which it was formed in (act 520). In act 525, the die is flip-chip mounted to a substrate such that bond pads on the die are electrically coupled to substrate bonding pads with, for example, copper pillars or solder bumps and such that the front or active side of the die faces the substrate and the rear of the die is exposed. In act 530, bond wires, for example, gold bond wires are bonded to different areas of the backside metallization to externally electrically connect the different areas of backside metallization of the die and associated through-wafer vias and internal circuitry of the die. In some embodiments, the length, geometry, or both of the bond wires may be selected based on measured electrical parameters of circuitry or internal circuit elements of the die. After the bond wires are connected to the backside of the die, in act 535, the die and bond wires may be encapsulated in an overmold material for protection from the environment.

Figure 6:
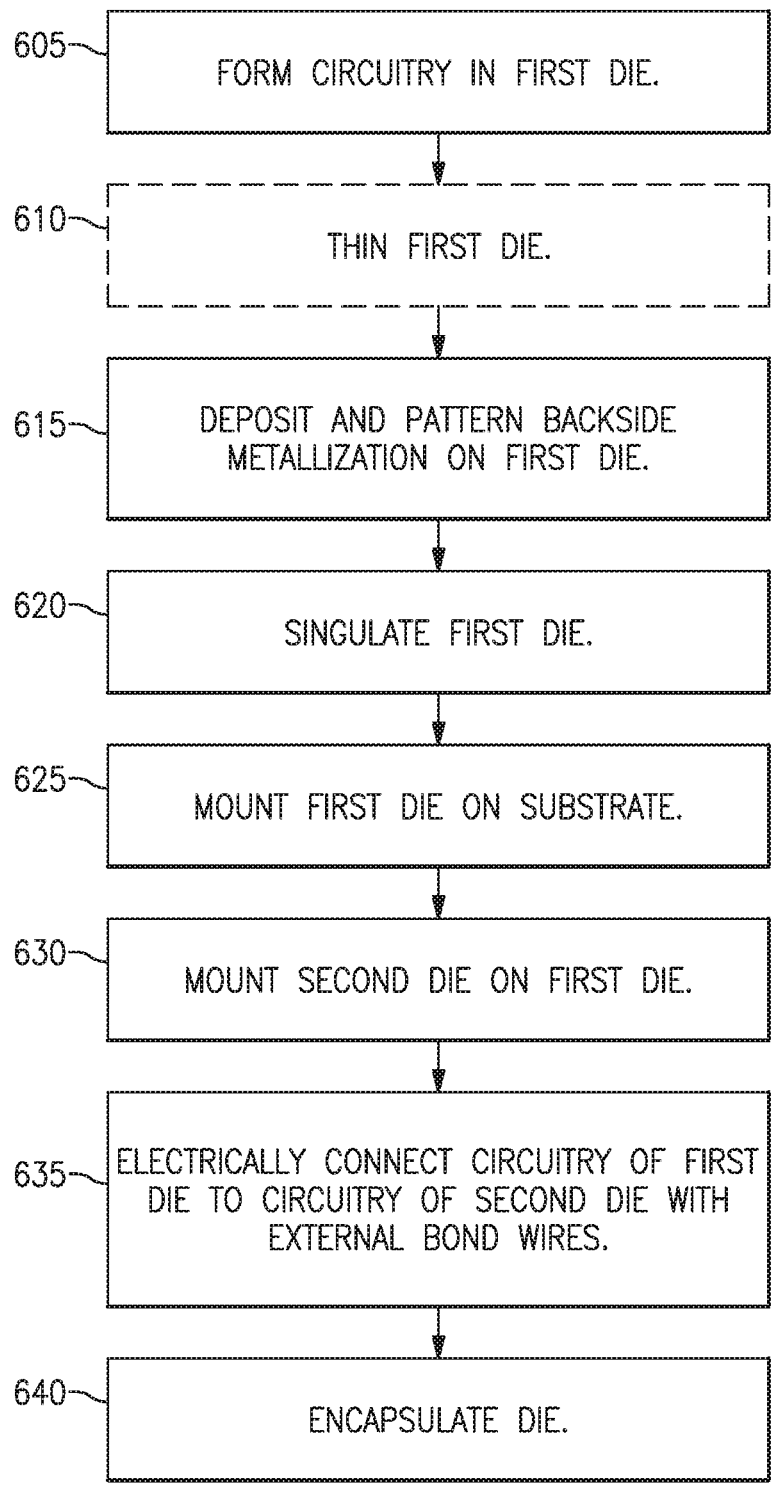
FIG. 6 is a flow chart of a method of forming an electrical structure.

A method of fabricating a packaged stack of die such as shown in FIG. 3 is illustrated in the flow chart of FIG. 6. Acts 605-625 are substantially identical to acts 505-525 of the flowchart of FIG. 5 and thus are not described in detail herein. In act 630, a second die, for example, a die configured for wirebond electrical connections and including one or more circuitry components, is mounted on the first die. The bottom or back side of the second die may be secured to the back side of the first die using an adhesive, for example, epoxy or solder. In some embodiments the second die may include one or more through-wafer vias in electrical communication with circuitry within or on the front side of the second die and exposed on the bottom or back side of the second die. The through-wafer vias of the second die, when present, may be electrically connected to portions of the backside metallization of the first die and to associated circuitry in the first die through the through-wafer vias. In other embodiments, all electrical connections to the circuitry of the second die are on the front or top side. In act 635, electrical connections are made between portions of the backside metallization of the first die and bond pads on the second die with external bond wires. In some embodiments, the length, geometry, or both of the bond wires may be selected based on measured electrical parameters of circuitry or internal circuit elements of the first die, the second die, or both, for example, to provide impedance matching between circuitry of the first die and circuitry of the second die. After the bond wires are connected between the portions of the backside metallization of the first die and the bond pads of the second die, in act 640, the die and bond wires may be encapsulated in an overmold material for protection from the environment.

Figure 7:
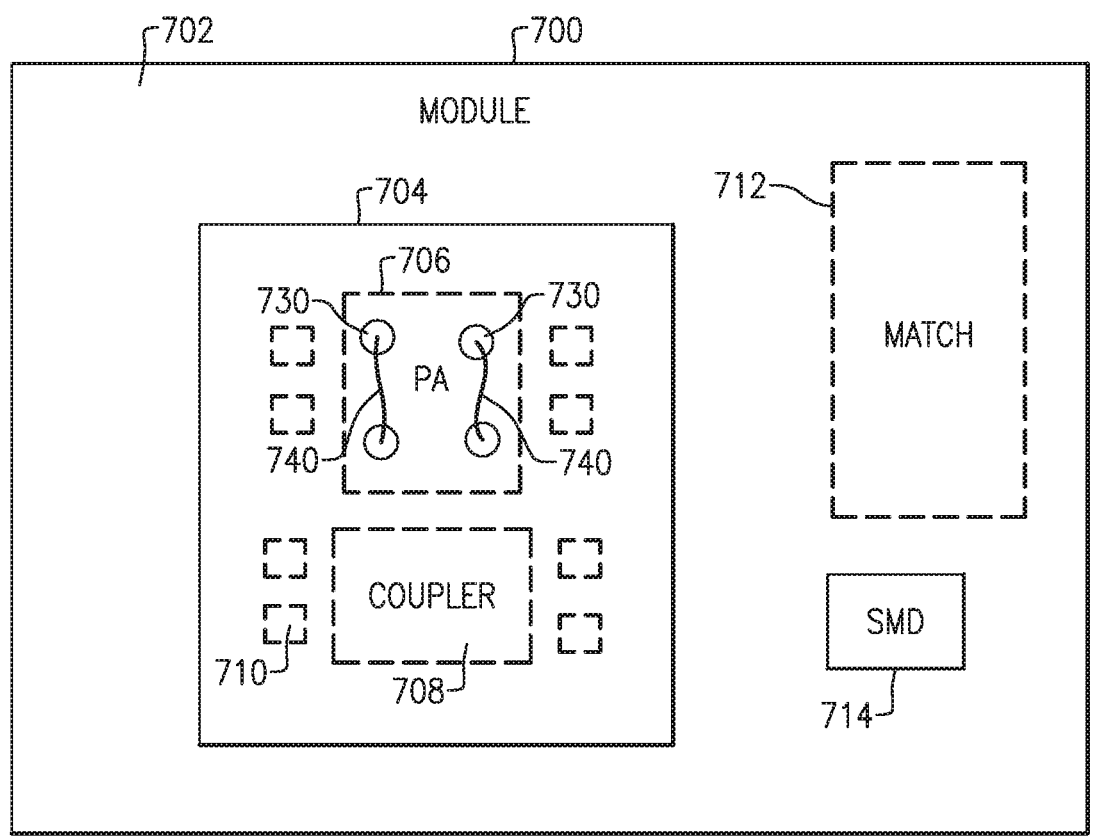
FIG. 7 illustrates an electronic module including an embodiment of a flip-chip die as disclosed herein.

Embodiments described herein can be implemented in a variety of different modules including, for example, a front-end module, an impedance matching module, an antenna tuning module, an antenna switch module, or the like. FIG. 7 illustrates one example of a module 700 that can include any of the embodiments or examples of the flip-chip ICs disclosed herein. Module 700 has a packaging substrate 702 that is configured to receive a plurality of components, for example, die 704. In some embodiments, the die 704 can include a power amplifier (PA) circuit 706 and a coupler 708, or other RF components or circuitry known in the art, for example, a switch or filter. One or more external bond wires 740 may electrically connect areas of backside metallization 730 and associated circuitry within the die 704, for example, circuitry within the PA circuit 706. The one or more external bond wires 740 may be utilized as inductors in a portion of a matching circuit for the PA circuit 706. A plurality of connection pads 710, for example, solder or gold bumps or posts can facilitate electrical connections to bond pads (not shown) on the substrate 702 to facilitate passing of various power and signals to and from the die 704.

In some embodiments, other components can be mounted on or formed on the packaging substrate 702. For example, one or more surface mount devices (SMD) 714 and one or more matching networks 712 can be implemented. In some embodiments, the packaging substrate 702 can include a laminate substrate.

In some embodiments, the module 700 can also include one or more packaging structures to, for example, provide protection and facilitate easier handling of the module 700. Such a packaging structure can include overmold material formed over the packaging substrate 702 and dimensioned to substantially encapsulate the various circuits and components thereon, for example, die 704.

Embodiments of the module 700 may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Figure 8:
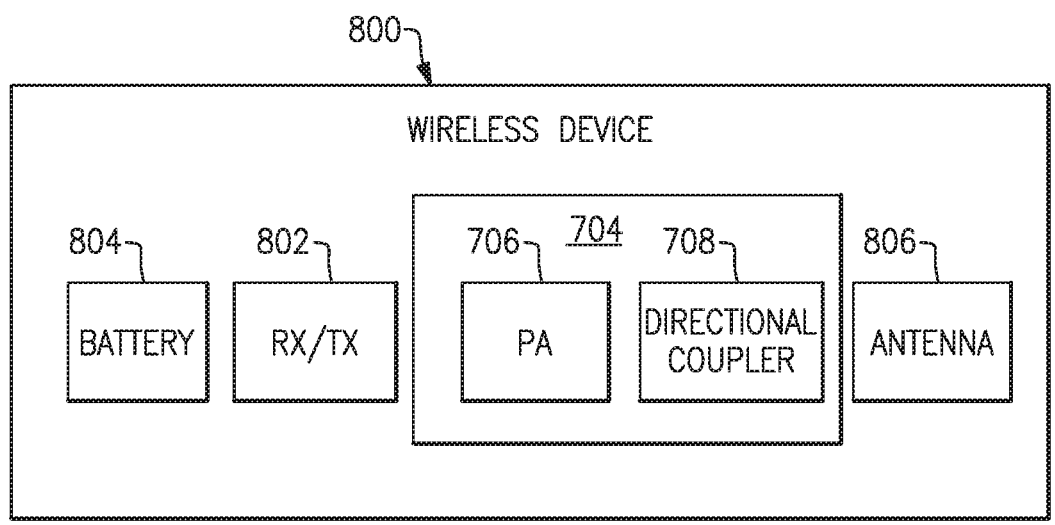
FIG. 8 illustrates a wireless device including an embodiment of a flip-chip die as disclosed herein.

FIG. 8 is a block diagram of a wireless device 800 including a flip-chip mounted die 704 according to certain embodiments. The wireless device 800 can be a cellular phone, smart phone, tablet, modem, communication network or any other portable or non-portable device configured for voice and/or data communication. The wireless device 800 includes an antenna 806 that receives and transmits power signals and a coupler 708 that can use a transmitted signal for analysis purposes or to adjust subsequent transmissions. For example, the coupler 708 can measure a transmitted RF power signal from the power amplifier (PA) 706, which amplifies signals from a transceiver 802. Coupler 708 and PA 706 may be included in a common die 704. The transceiver 802 can be configured to receive and transmit signals in a known fashion. As will be appreciated by those skilled in the art, the power amplifier 706 can be a power amplifier module including one or more power amplifiers. The wireless device 800 can further include a battery 804 to provide operating power to the various electronic components in the wireless device.

Figure 9:
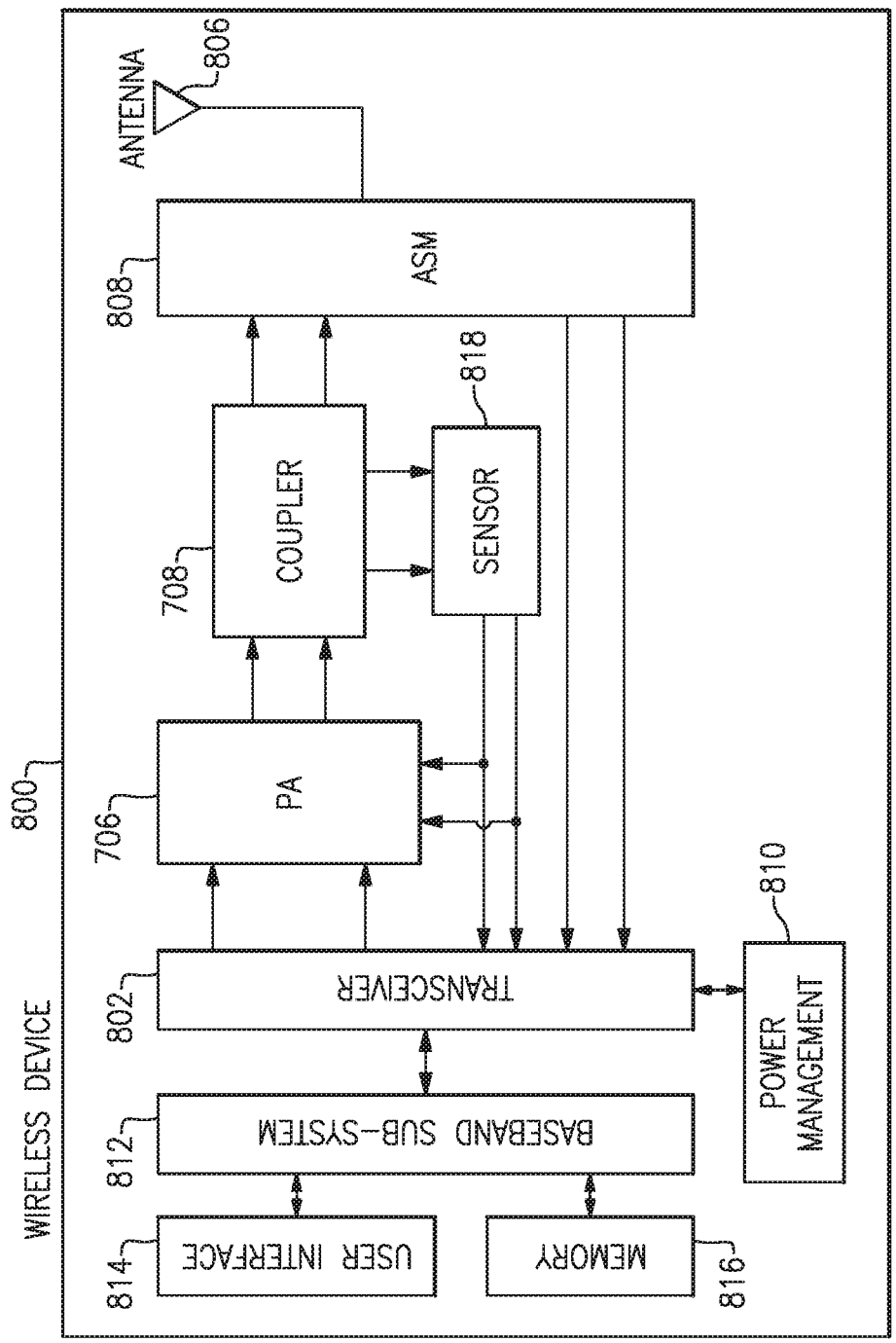
FIG. 9 is a more detailed illustration of the wireless device of FIG. 8.

FIG. 9 is a more detailed block diagram of an example of the wireless device 800. As shown, the wireless device 800 can receive and transmit signals from the antenna 806. The transceiver 802 is configured to generate signals for transmission and/or to process received signals. Signals generated for transmission are received by the power amplifier (PA) 706, which amplifies the generated signals from the transceiver 802. In some embodiments, transmission and reception functionalities can be implemented in separate components (e.g. a transmit module and a receiving module), or be implemented in the same module. The antenna switch module 808 can be configured to switch between different bands and/or modes, transmit and receive modes, etc. As is also shown in FIG. 9, the antenna 806 both receives signals that are provided to the transceiver 802 via the antenna switch module 808 and also transmits signals from the wireless device 800 via the transceiver 802, the PA 706, the coupler 708, and the antenna switch module 808. However, in other examples multiple antennas can be used.

The wireless device 800 of FIG. 9 further includes a power management system 810 that is connected to the transceiver 802 that manages the power for the operation of the wireless device. The power management system 810 can also control the operation of a baseband sub-system 812 and other components of the wireless device 800. The power management system 810 provides power to the wireless device 800 via the battery 804 (FIG. 8) in a known manner, and includes one or more processors or controllers that can control the transmission of signals and can also configure the coupler 708 based upon the frequency of the signals being transmitted, for example.

In one embodiment, the baseband sub-system 812 is connected to a user interface 814 to facilitate various input and output of voice and/or data provided to and received from the user. The baseband sub-system 812 can also be connected to memory 816 that is configured to store data and/or instructions to facilitate the operation of the wireless device, and/or to provide storage of information for the user.

The power amplifier 706 can be used to amplify a wide variety of RF or other frequency-band transmission signals. For example, the power amplifier 706 can receive an enable signal that can be used to pulse the output of the power amplifier to aid in transmitting a wireless local area network (WLAN) signal or any other suitable pulsed signal. The power amplifier 706 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier 706 and associated components including switches and the like can be fabricated on GaAs substrates using, for example, pHEMT or BiFET transistors, or on a silicon or SOI substrate using CMOS transistors.

Still referring to FIG. 9, the wireless device 800 can also include a coupler 708 having one or more directional EM couplers for measuring transmitted power signals from the power amplifier 706 and for providing one or more coupled signals to a sensor module 818. The sensor module 818 can in turn send information to the transceiver 802 and/or directly to the power amplifier 706 as feedback for making adjustments to regulate the power level of the power amplifier 706. In this way the coupler 708 can be used to boost/decrease the power of a transmission signal having a relatively low/high power. It will be appreciated, however, that the coupler 708 can be used in a variety of other implementations.

In certain embodiments in which the wireless device 800 is a mobile phone having a time division multiple access (TDMA) architecture, the coupler 708 can advantageously manage the amplification of an RF transmitted power signal from the power amplifier 706. In a mobile phone having a time division multiple access (TDMA) architecture, such as those found in Global System for Mobile Communications (GSM), code division multiple access (CDMA), and wideband code division multiple access (W-CDMA) systems, the power amplifier 706 can be used to shift power envelopes up and down within prescribed limits of power versus time. For instance, a particular mobile phone can be assigned a transmission time slot for a particular frequency channel In this case the power amplifier 706 can be employed to aid in regulating the power level of one or more RF power signals over time, so as to prevent signal interference from transmission during an assigned receive time slot and to reduce power consumption. In such systems, the coupler 708 can be used to measure the power of a power amplifier output signal to aid in controlling the power amplifier 706, as discussed above. The implementation shown in FIG. 9 is exemplary and non-limiting. For example, the implementation of FIG. 9 illustrates the coupler 708 being used in conjunction with a transmission of an RF signal, however, it will be appreciated that coupler 708 can also be used with received RF or other signals as well.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Directional terms such as "above," below," "left," "right," etc. are used herein as a matter of convenience for referencing various surfaces and orientations of features disclosed herein. There directional terms do not imply that the aspects and embodiments disclosed herein are necessarily oriented in any particular orientation. Any dimensions provided in the above disclosure are meant as examples only and are not intended to be limiting.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while acts of the disclosed processes are presented in a given order, alternative embodiments may perform routines having acts performed in a different order, and some processes or acts may be deleted, moved, added, subdivided, combined, and/or modified. Each of these processes or acts may be implemented in a variety of different ways. Also, while processes or acts are at times shown as being performed in series, these processes or acts may instead be performed in parallel, or may be performed at different times.

The teachings of the invention provided herein can be applied to other systems, not necessarily the system described above. The elements and acts of the various embodiments described above can be combined to provide further embodiments.

What is claimed is:

1. A flip-chip integrated circuit semiconductor die comprising:
    a front side including active circuitry formed therein and a plurality of bond pads in electrical communication with the active circuitry;
    at least two through-wafer vias extending at least partially though the semiconductor die and having portions at a rear side of the semiconductor die; and
    a bond wire external to the semiconductor die and extending between and electrically coupling the portions of the at least two through-wafer vias to one another at the rear side of the semiconductor die.

2. The flip-chip integrated circuit semiconductor die of claim 1 further comprising backside metallization disposed on at least the portions of the at least two through-wafer vias at the rear side of the semiconductor die, the bond wire being electrically coupled to the portions of the at least two through-wafer vias through the backside metallization.

3. The flip-chip integrated circuit semiconductor die of claim 1 wherein the active circuitry forms at least a portion of a power amplifier.

4. The flip-chip integrated circuit semiconductor die of claim 3 wherein the bond wire is an inductive element in a matching circuit for the power amplifier.

5. The flip-chip integrated circuit semiconductor die of claim 3 wherein the bond wire exhibits a quality factor of at least 60.

6. The flip-chip integrated circuit semiconductor die of claim 1 wherein the active circuitry includes radio frequency circuitry.

7. An electronics module including the flip-chip integrated circuit semiconductor die of claim 1.

8. An electronic device including the electronics module of claim 7.

9. A radio frequency device including the electronics module of claim 7.

10. An electrical structure comprising:
    a first integrated circuit semiconductor die including a front side having active circuitry formed therein, a plurality of bond pads in electrical communication with the active circuitry, and at least two through-wafer vias extending at least partially though the semiconductor die and having portions at a rear side of the semiconductor die;
    a second integrated circuit semiconductor die including a rear side mounted on the rear side of the first integrated circuit semiconductor die and having bond pads disposed on a front side thereof; and
    at least one bond wire external to the first integrated circuit semiconductor die and the second integrated circuit semiconductor die and electrically coupling at least one of the at least two through-wafer vias of the first integrated circuit semiconductor die to at least one bond pad of the second integrated circuit semiconductor die.

11. The electrical structure of claim 10 wherein the second integrated circuit semiconductor die includes active circuitry in the front side thereof.

12. The electronic structure of claim 10 wherein the bond wire is an inductive element in a matching circuit for active circuitry in one of the first integrated circuit semiconductor die and the second integrated circuit semiconductor die.

13. The electronic structure of claim 12 wherein the bond wire exhibits a quality factor of at least 60.

14. The electrical structure of claim 12 wherein the active circuitry includes a power amplifier.

* * * * *